US010660249B2

(12) United States Patent
Kunihiro et al.

(10) Patent No.: US 10,660,249 B2
(45) Date of Patent: May 19, 2020

(54) SEPARATE INSTALLATION-TYPE REEL HOLDING DEVICE

(71) Applicant: FUJI CORPORATION, Chiryu-shi (JP)

(72) Inventors: Tsutomu Kunihiro, Okazaki (JP); Masataka Iwasaki, Anjyo (JP)

(73) Assignee: FUJI CORPORATION, Chiryu-shi (JP)

( * ) Notice: Subject to any disclaimer, the term of this patent is extended or adjusted under 35 U.S.C. 154(b) by 171 days.

(21) Appl. No.: 15/752,281

(22) PCT Filed: Sep. 9, 2015

(86) PCT No.: PCT/JP2015/075555
§ 371 (c)(1),
(2) Date: Feb. 13, 2018

(87) PCT Pub. No.: WO2017/042902
PCT Pub. Date: Mar. 16, 2017

(65) Prior Publication Data
US 2018/0242482 A1    Aug. 23, 2018

(51) Int. Cl.
H05K 13/02    (2006.01)
H05K 13/04    (2006.01)
B65H 75/02    (2006.01)

(52) U.S. Cl.
CPC .......... H05K 13/021 (2013.01); B65H 75/02 (2013.01); H05K 13/0417 (2013.01)

(58) Field of Classification Search
CPC .......... H05K 13/0417; H05K 13/0419; H05K 13/02; H05K 13/086; H05K 13/021; B65H 75/02; B65H 19/12
See application file for complete search history.

(56) References Cited

U.S. PATENT DOCUMENTS 2,047,769 A * 7/1936 Cullen ................. B65H 19/126
242/559.4
2,452,481 A * 10/1948 Morehead ............. B65H 49/38
414/428
(Continued)

FOREIGN PATENT DOCUMENTS

JP    2004-228207 A    8/2004
JP    2011-138834 A    7/2011
(Continued)

OTHER PUBLICATIONS

International Search Report dated Dec. 8, 2015, in PCT/JP2015/075555 filed Sep. 9, 2015.

Primary Examiner — Michael E Gallion
(74) Attorney, Agent, or Firm — Oblon, McClelland, Maier & Neustadt, L.L.P.

(57) ABSTRACT

A standalone type reel holding device configured to be set separately to a component mounter provided with a component supply device, the component supply device including multiple feeder devices and a main-body-side reel holding section configured to hold multiple tape reels around in a rotatable and exchangeable manner, wherein the standalone type reel holding device holds separately-located tape reels different to the tape reels held by the main-body-side reel holding section in a rotatable and exchangeable manner, and supplies carrier tapes wound on the separately-located tape reels to the feeder devices. Thus, it is possible to increase the overall quantity of carrier tapes supplied to feeder devices from the main-body-side reel holding section and the standalone type reel holding device.

7 Claims, 5 Drawing Sheets

(56) References Cited

U.S. PATENT DOCUMENTS

| | | | |
|---|---|---|---|
| 3,020,625 A * | 2/1962 | Willis | H05K 13/0417 |
| | | | 29/834 |
| 9,137,936 B2 * | 9/2015 | Katsumi | H05K 13/0417 |
| 9,914,279 B2 * | 3/2018 | Van der Kaap | B31D 5/0039 |
| 10,004,168 B2 * | 6/2018 | Mizuno | H05K 13/0417 |
| 10,159,170 B2 * | 12/2018 | Ohashi | H05K 13/02 |
| 10,349,570 B2 * | 7/2019 | Hara | H05K 13/0417 |
| 10,477,745 B2 * | 11/2019 | Ikeda | H05K 13/0417 |
| 2005/0077416 A1 * | 4/2005 | Heikaus | B65H 19/2207 |
| | | | 242/533.4 |
| 2010/0071204 A1 | 3/2010 | Yonemitsu et al. | |
| 2013/0047427 A1 * | 2/2013 | Yagi | H05K 13/0411 |
| | | | 29/832 |
| 2014/0150260 A1 * | 6/2014 | Fischer | H01R 43/055 |
| | | | 29/862 |
| 2015/0115093 A1 * | 4/2015 | Tanokuchi | H05K 13/021 |
| | | | 242/560.1 |
| 2016/0185093 A1 * | 6/2016 | Ohashi | B32B 37/12 |
| | | | 156/378 |
| 2017/0354070 A1 * | 12/2017 | Kobayashi | H05K 13/021 |
| 2018/0042151 A1 * | 2/2018 | Ohashi | H05K 13/02 |
| 2018/0376635 A1 * | 12/2018 | Iisaka | H05K 13/0452 |
| 2019/0045680 A1 * | 2/2019 | Kondo | H05K 13/086 |
| 2019/0045682 A1 * | 2/2019 | Yamamoto | H05K 13/0888 |
| 2019/0185288 A1 * | 6/2019 | Hawkins | B65H 49/325 |
| 2019/0269049 A1 * | 8/2019 | Iwasaki | H05K 13/0419 |
| 2019/0307034 A1 * | 10/2019 | Eguchi | H05K 13/0417 |

FOREIGN PATENT DOCUMENTS

| | | |
|---|---|---|
| JP | 2013-046024 A | 3/2013 |
| JP | 2015-053310 A | 3/2015 |
| WO | 2008/035764 A1 | 3/2008 |

* cited by examiner

SEPARATE INSTALLATION-TYPE REEL HOLDING DEVICE

TECHNICAL FIELD

The present application relates to a standalone type reel holding device configured to supply carrier tape to a component supply device provided on a component mounter from externally.

BACKGROUND ART

Equipment such as solder printers, component mounters, reflow ovens, and board inspection machines is used to produce boards mounted with many components. Conventionally, this equipment is connected to form a board production line. Among this equipment, there are component mounters provided with a board conveyance device, a component supply device, a component transfer device, and a control device. Many component supply devices are configured such that multiple feeder devices, which feed carrier tape in which cavities holding components are formed in a line, are lined up in a row. Conventionally, feeder devices are provided with an integrated reel holding section that holds a tape reel around which carrier tape is wound, or are provided with a reel holding section as a separate body. Examples of technology related to this kind of component supply device and feeder device are disclosed in patent literature 1 to 3.

An electronic component supply device of patent literature 1 includes multiple tape feeders (feeder devices) and a feeder holding device that holds the feeders. The multiple tape feeders can be divided into a first section that includes a component supply section and a guide section for taped components (carrier tape), and a second section that includes a taped components feeding device. Further, the multiple tape feeders are held in the feeder holding device in a state with each component supply section lined up in multiple rows. Accordingly, it is possible to increase the quantity of tape feeders that can be loaded.

Meanwhile, a component supply device of patent literature 2 includes a reel holding section that holds reels on which is wound component supply tape, and a supply device main body section provided with a component supply tape indexing device. The reel holding section is attached to the supply device main body section, and is movable to a component supply position and a reel attachment and removal position. Accordingly, it is possible to line up multiple reel holding sections close to each other, such that a component supply system including multiple supply devices can be made compact.

Further, the batch exchange cart of patent literature 3 holds many tape feeders (feeder devices) lined up next to each other and is removably attached to a main body of a component mounter, and is provided with a reel holding section that holds reels such that tape feeding is possible, and a reel stocking section that holds spare reels lined up in a straight line. Thus, reel exchange work can be performed in a compact work space, thereby improving workability.

CITATION LIST

Patent Literature

Patent literature 1: JP-A-2011-138834
Patent literature 2: JP-A-2013-46024
Patent literature 3: JP-A-2004-228207

SUMMARY

Technical Problem

However, the quantity of feeders that can be loaded and the external dimensions of the component mounter are decided by the design specifications of those items. However, after the design specifications have been set, there are many cases in which it is desirable to increase the quantity of loadable feeder devices such that the quantity of component types that can be supplied is increased, without changing the external dimensions. In this case, because there are restrictions in the external dimensions, the technology disclosed in patent literature 1 and 2 cannot be applied as is. For this need, it is possible to increase the loaded quantity by improving technology of the main body of the feeder device, but adding capacity to the reel holding section is difficult.

Also, there are also many cases in which feeder devices have compatibility with each other such that they can be set in rows on a component supply device regardless of the type or construction. Therefore, when a feeder device with a new type main body is loaded on an existing component mounter, there are cases in which the quantity of carrier tapes that can be supplied from the reel holding section is insufficient. In this case, with the technology of patent literature 1 to 3, it is necessary to manufacture a new reel holding section that matches the new type feeder device, and to create a configuration in which the entire set of feeder devices and reel holding sections can be exchanged in one go. Thus, it is not possible to maintain compatibility extending beyond type and construction, meaning that current reel holding sections are wasted and manufacturing costs are high.

The present disclosure takes account of the above problems with conventional technology, and an object thereof is to provide a standalone type reel holding device capable of increasing the quantity of carrier tapes that can be supplied to a feeder device in a case in which there is an insufficient quantity of carrier tapes being supplied from a reel holding section that is provided on a main body of a component supply device.

Solution to Problem

To solve the above problems, a standalone type reel holding device of the present disclosure is configured to be set separately to a component mounter provided with a component supply device, the component supply device including multiple feeder devices configured to sequentially supply multiple components by feeding carrier tape in which the multiple components are held and a main-body-side reel holding section configured to hold multiple tape reels around which are wound the carrier tapes in a rotatable and exchangeable manner, the main-body-side reel holding section being provided separately to or integrated with the feeder device, wherein the standalone type reel holding device holds separately-located tape reels different to the tape reels held by the main-body-side reel holding section in a rotatable and exchangeable manner, and supplies the carrier tapes wound on the separately-located tape reels to the feeder devices.

Advantageous Effects

A standalone type reel holding device of the present disclosure, in a case in which a quantity of carrier tapes supplied from a main-body-side reel holding section provided on a component supply device is insufficient, is located separately to the component mounter, holds a separately-located tape reel, and supplies carrier tape from the separately-located tape reel to the feeder device. Thus, it is possible to increase the overall quantity of carrier tapes supplied to feeder devices from the main-body-side reel holding section and the standalone type reel holding device.

DESCRIPTION OF EMBODIMENTS

1. Overall Configuration of Component Mounter 1

Figure 1:
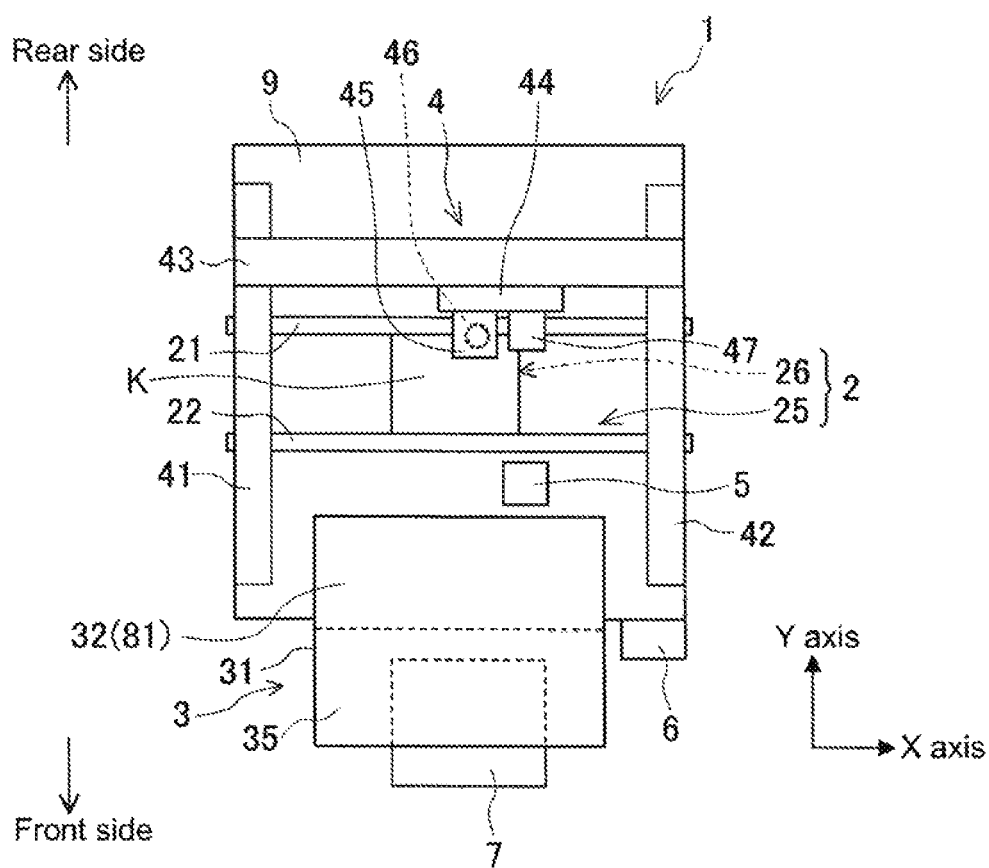
FIG. 1 is a plan view showing the overall configuration of a component mounter that uses an embodiment of a standalone type reel holding device.

An embodiment of the present disclosure, standalone type reel holding device 7, will be described with reference to FIGS. 1 to 4. First, the overall configuration of component mounter 1 that uses standalone type reel holding device 7 will be described. FIG. 1 is a plan view showing the overall configuration of a component mounter that uses an embodiment of a standalone type reel holding device. The direction from the left side of the page to the right side in FIG. 1 is the X-axis direction, in which board K is conveyed, and the direction from the front at the bottom of the page to the rear at the top of the page is the Y-axis direction. Component mounter 1 is configured from items such as board conveyance device 2, component supply device 3, component transfer device 4, component camera 5, and control device 6 assembled on base 9. Board conveyance device 2, component supply device 3, component transfer device 4, and component camera 5 are controlled from control device 6 such that each performs specified work.

Board conveyance device 2 is configured from items such as board conveyance section 25 and backup section 26. Board conveyance section 25 is configured from items such as pair of guide rails 21 and 22, and a pair of conveyor belts, and conveys board K to a component mounting position. Backup section 26 is arranged below the mounting position and raises and positions board K.

Component supply device 3 is configured around feeder pallet 31. Feeder pallet 31 is detachably provided on the front side of base 9. Feeder pallet 31 includes feeder attachment section 32 on the rear side, and main-body-side reel holding section 35 on the front side. Feeder attachment section 32 is formed such that multiple feeder devices 81 can be arranged in a row. Main-body-side reel holding section 35 is formed to be able to hold multiple tape reels TR in a rotatable and exchangeable manner. Details of the configuration of feeder pallet 31 are described later. Standalone type reel holding device 7, as shown in FIG. 1, is provided separately to and below main-body-side reel holding section 35.

Component transfer device 4 picks up components from the multiple feeder devices 81, transfers them to a positioned board K, and mounts the components. Component transfer device 4 is an XY robot type device that is capable of moving horizontally in the X-axis direction and the Y-axis direction. Component transfer device 4 is configured from pair of Y-axis rails 41 and 42 and Y-axis slider 43 that form a head driving mechanism, mounting head 44 that is driven in the X-axis direction and the Y-axis direction, nozzle tool 45, suction nozzle 46, board camera 47, and the like. Nozzle tool 45 is exchangeably held on mounting head 44, and holds suction nozzle 46 that picks up and mounts components on board K. Board camera 47 is provided on mounting head 44 and images position reference marks provided on board K to detect an accurate position of board K.

Component camera 5 is provided facing upwards on an upper surface of base 9 between board conveyance device 2 and feeder device 3. Component camera 5 images a state of a component picked up by suction nozzle 46 as the component is moved from feeder device 3 to above board K by mounting head 44. Control device 6 is assembled on base 9, but the arrangement position is not particularly restricted. Control device 6 controls component mounting work in accordance with a predetermined mounting sequence.

Figure 2:
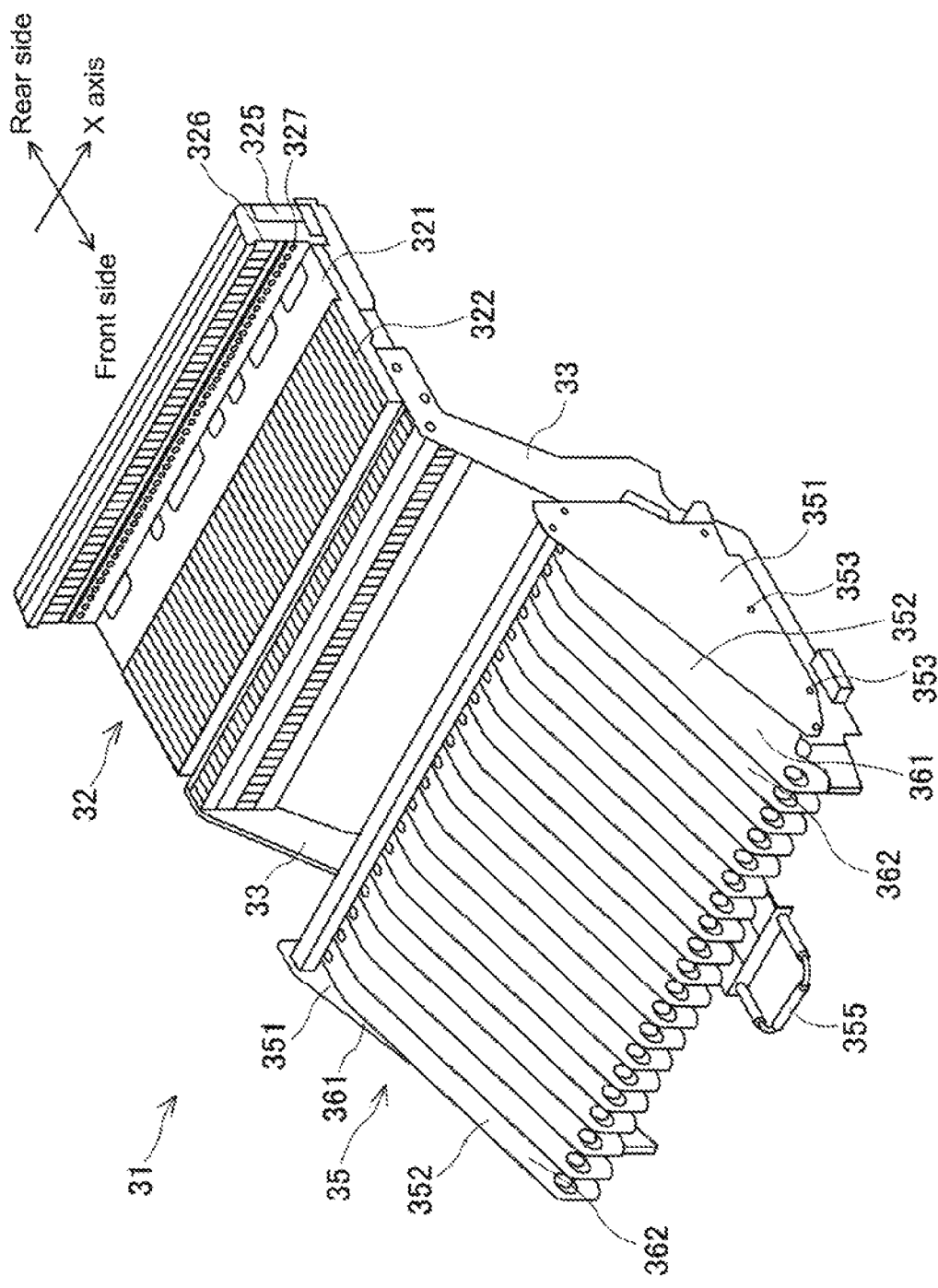
FIG. 2 is a perspective view of a feeder pallet that forms the base of a component supply device.

Details of the configuration of feeder pallet 31 are described next. FIG. 2 is a perspective view of feeder pallet 31 that forms the base of component supply device 3. Feeder pallet 31 includes feeder attachment section 32 on the rear side, and main-body-side reel holding section 35 on the front side. Feeder attachment section 32 is formed such that upright section 325 is established at the rear end of substantially rectangular horizontal section 321. Slots 322 that extend in the front-rear direction (Y-axis direction) are lined up in the X-axis direction on horizontal section 321. In the present embodiment, forty slots 322 are provided. Pallet-side connectors 326 are provided on upright section 325 at positions corresponding to slots 322. Positioning holes 327 are provided at the top and bottom of each pallet-side connector 326 (in FIG. 2, the upper positioning holes cannot be seen).

Multiple feeder devices 81 are inserted from the front to the rear into each slot 322 so as to be attached lined up in the X-axis direction. Thus, multiple feeder devices 81 are arranged in a row in an arrangement direction, which is the X-axis direction. Positioning pins provided at the top and bottom of the rear surface of feeder device 81 are inserted into the upper and lower positioning holes 327. Thus, feeder device 81 is positioned with respect to feeder pallet 31. At the same time, a feeder-side connector provided between the upper and lower positioning pins of feeder device 81 is inserted into pallet-side connector 326. Thus, feeder device 81 is connected such that communication with control device 6 is possible and power is supplied.

Arm members 33 are fixed at both ends in the X-axis direction to the front side of horizontal section 321. The two arm members 33 are formed to extend horizontally at first, then to extend diagonally forward and down, and finally to extend horizontally again. The two arm members 33 protrude from the front of base 9 when component supply device 3 is attached. Main-body-side reel holding section 35 is provided on the diagonal portion and the front horizontal portion of arm member 33. Main-body-side reel holding section 35 is arranged lower than horizontal section 321 so as not to interfere with the loading and unloading of feeder devices 81. Handle 355 is provided on a lower side of main-body-side reel holding section 35. The entire feeder pallet 31 is removed from base 9 by handle 355 being pulled.

Main-body-side reel holding section 35 is provided as a separate body to feeder device 81. Main-body-side reel holding section 35 is formed from items such as a bottom plate that cannot be seen in FIG. 2, two side plates 351, twenty dividing plates 352, and two shaft members 353. The two side plates 351 are approximately right-angled triangle shaped plates. A first side adjacent to the right angle of the plate extends in a front-rear direction, and a second side adjacent to the right angle extends in a vertical direction on the rear side, with the hypotenuse extending from the lower front section to the upper rear section. As shown in FIG. 2, the two rear plates 351 are arranged spaced apart horizontally by the same distance as the width dimension of feeder pallet 31, and are fixed to the bottom plate.

The twenty dividing plates 352 are long plates in the front-rear direction. These dividing plates 352 are arranged parallel to side plates 351, are equally spaced, and fixed to the bottom plate. Single reel storage sections 361 are demarcated by the dividing plates 352 at both ends and the two side plates 351. The two single reel storage sections 361 each exchangeably store one tape reel TR. Multiple reel storage sections 362 are demarcated by adjacent dividing plates 352. A total of nineteen multiple reel storage sections 362 each exchangeably store two tape reels TR lined up in the X-axis direction. Thus, the maximum quantity of tape reels TR that can be held is forty, which is the same quantity as the quantity of slots 322.

Two round rod-shaped shaft members 353 connect the respective front sides of a lower section of the two side plates 351 and the respective rear sides of a lower section of the two side plates 351. The two parallel front and rear shaft members 353 each pass through shaft holes formed in each of the dividing plates 352. Two rollers each rotatably supported on the two front and rear shaft members 353 are arranged on the inside of single reel storage sections 361. The two front and rear rollers rotatably support the outer circumferential surface of tape reel TR. Two rollers each rotatably supported on the two front and rear shaft members 353 are arranged on the inside of single reel storage sections 361 lined up in the X-axis direction. From the total of four rollers, two at the front and rear form a set that rotatably supports the outer circumferential surface of tape reel TR.

By using two rollers arranged spaced apart in the front-rear direction for one tape reel TR, it is possible to rotatably and exchangeably support multiple types of tape reels TR with different diameters. However, the configuration is not limited to this, the outer circumference of one tape reel TR may be supported at three or more points. Also, the rollers may be omitted, and the outer circumferential surface of shaft members 353 can be given a slippery finish.

Conventional feeder device 81 is loaded on a single slot 322 and only requires a single tape reel TR. Thus, main-body-type reel holding section 35 was sufficient for holding the tape reel TR. However, after the design specifications of component mounter 1 have been set, there are many cases in which it is desirable to increase the quantity of loadable feeder devices 81 such that the quantity of component types that can be supplied is increased, without changing the external dimensions. In this case, for example, as disclosed in patent literature 1, the quantity of integrated feeder devices in which multiple tape feeders are integrated in one body may be increased, but it is difficult to add to the capacity of the reel holding section, thus the quantity of carrier tapes that can be fed is insufficient.

Also, because new type feeder devices are loaded on feeder attachment section 32 instead of conventional feeder device 81, the quantity of carrier tapes that can be fed is insufficient. For example, auto loading feeder 82 (for example, refer to the feeder that performs automatic supply without splicing in JP-A-2014-82454), occupies only one slot 322, but requires carrier tapes CT to be fed from two tape reels TR in order to eliminate splicing work. Also, a multiple feeder device (for example, refer to patent document JP4856761) that supplies two types of components also occupies only one slot 322 but requires two carrier tapes CT.

2. Method for Setting and Configuration of Standalone Type Reel Holding Device 7

Figure 3:
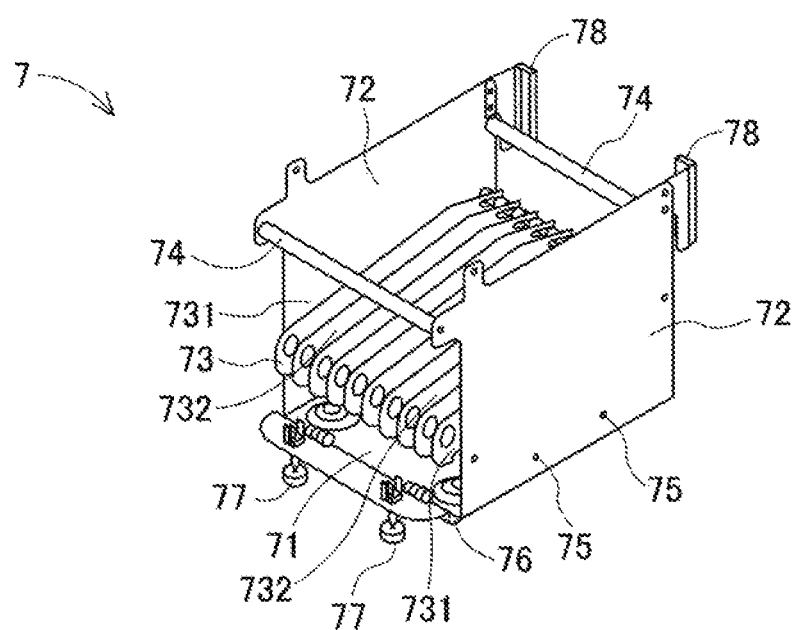
FIG. 3 is a perspective view showing the configuration of a standalone type reel holding device.
Figure 4:
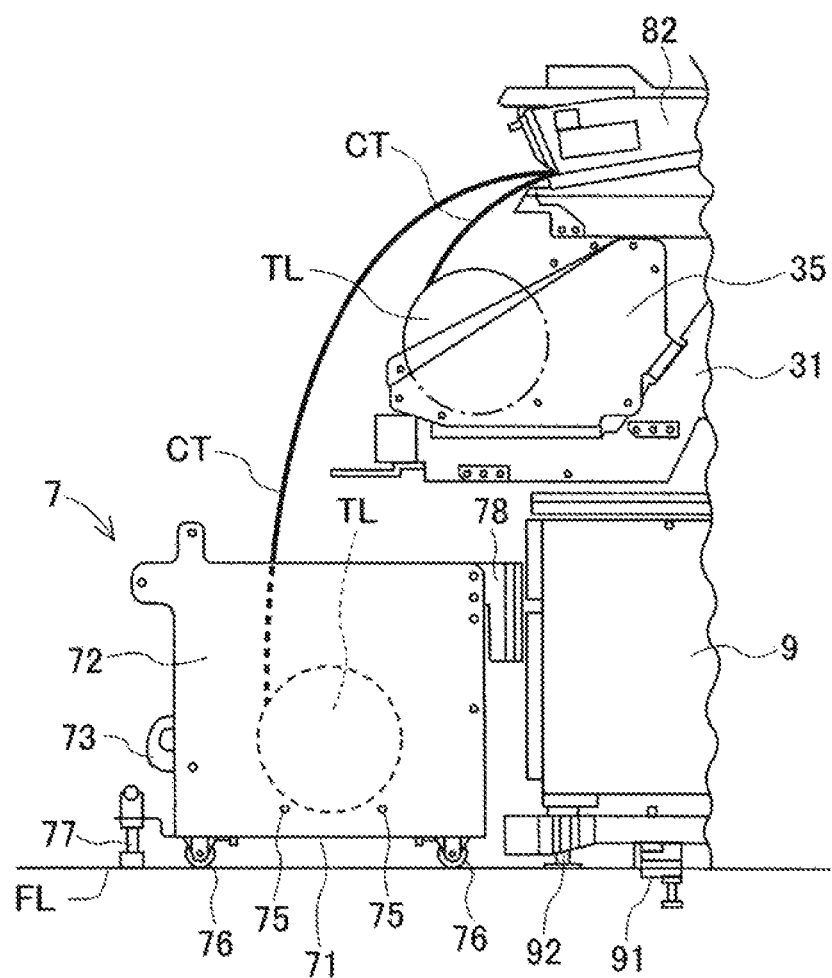
FIG. 4 is a side view of the standalone type reel holding device located in front of a component mounter.

As described above, when the quantity of carrier tapes being supplied from main-body-side reel holding section 35 is insufficient, standalone type reel holding device 7 is used. FIG. 3 is a perspective view showing the configuration of standalone type reel holding device 7. Also, FIG. 4 is a side view of standalone type reel holding device 7 located in front of component mounter 1. In FIG. 4, auto loading feeder device 82 is shown as an example of a new type feeder device. In reality, many feeder devices 81 and 82 are loaded on feeder attachment section 32, and the many feeder devices 81 and 82 may be of different types and constructions.

As shown in FIG. 3, standalone type reel holding device 7 is configured from items such as bottom plate 71, two side plates 72, ten dividing plates 73, two support shafts 75, four casters 76, and two stoppers 77. Roughly rectangular side plates 72 are provided upright at the ends of roughly rectangular bottom plate 71.

The ten dividing plates 73 are long plates in the front-rear direction. These ten dividing plates 73 are arranged parallel to side plates 72, are equally spaced, and fixed to bottom plate 71. Single reel storage sections 731 are demarcated by the dividing plates 73 at both ends and the two side plates 72. The two single reel storage sections 731 each exchangeably store one tape reel TR. Multiple reel storage sections 732 are demarcated by adjacent dividing plates 72. A total of nine multiple reel storage sections 732 each exchangeably store two tape reels TR lined up in the X-axis direction. Thus, the maximum quantity of tape reels TR stored by standalone reel holding device 7 is twenty, which is half that of main-body-side reel holding section 35. Note that, it is not necessary for twenty tape reels TR to be set, nineteen or fewer may be set.

Two round rod-shaped shaft members 74 connect the respective front sides of an upper section of the two side plates 72 and the respective rear sides of an upper section of the two side plates 72. Two round rod-shaped shaft members 75 connect a lower section of the two side plates 72 towards the front and a lower section of the two side plates 72 towards the back. The two parallel front and rear shaft members 75 each pass through shaft holes formed in each of the dividing plates 73. Support shafts 75 may be provided with rollers similar to shaft member 353 of main-body-side reel holding section 35, or their outer circumferential surface may have a slippery finish and the rollers may be omitted. The two front and rear rollers provided on support shafts 75, or the front and rear support shafts 75 themselves, rotatably support the outer circumferential surface of tape reel TR.

By using two support shafts 75 arranged spaced apart in the front-rear direction for one tape reel TR, it is possible to rotatably and exchangeably support multiple types of tape reels TR with different diameters. However, the configuration is not limited to this, the outer circumference of one tape reel TR may be supported at three or more points.

As shown in FIG. 4, component mounter 1 is set up on floor FL using height adjustment section 92 and positioning section 91 formed on a bottom surface of base 9. The four casters 76 of standalone type reel holding device 7 are provided at the four corners on the bottom surface of bottom plate 71, and move on floor FL. Two of the four casters 76 are freely rotating, and the other two casters 76 are fixed in a given direction. The two stoppers 77 are provided at two locations at the front end of bottom plate 71. Stopper 77 is configured from a bolt extending in a vertical direction, and a restricting member that moves vertically and engages with the bolt. Further, contact plates 78 are provided facing rearwards towards the top section of the rear side of the two side plates 72.

Standalone type reel holding device 7 moves on floor FL via four casters 76. When standalone type reel holding device 7 is being used, the restricting member, stopper 77, is lowered so as to contact floor FL. By this, the movement of standalone type reel holding device 7 on the floor is restricted. Standalone type reel holding device 7 is usually used with contact plates 78 in contact with base 9, but contact plates 78 and base 9 may be separated from each other. Also, standalone type reel holding device 7 may be used at any given position in the X-axis direction.

3. Effects of Standalone Type Reel Holding Device 7

According to the above configuration, main-body-side reel holding section 35 can hold 40 tape reels TR, and standalone type reel holding device 7 can hold twenty tape reels TR. Thus, the overall quantity of carrier tapes CT that can be supplied by feeder devices 81 and 82 is increased from forty to sixty after standalone type reel holding device 7 is attached. Note that, standalone type reel holding device 7 is arranged further away from feeder devices 81 and 82 than main-body-side reel holding section 35, therefore there is no problem even if carrier tape CT is supplied in a slightly diagonal direction.

According to an embodiment above, even in a case in which a quantity of feeder devices 81 larger than the quantity from when the specifications were decided is loaded on feeder attachment section 32, there is no shortage in the overall quantity of carrier tapes CT that can be supplied. For example, when using integrated feeder devices, there is no shortage in the quantity of carrier tapes CT until the overall quantity of feeder devices 81 is sixty. Also, for example, there is no shortage of carrier tapes CT even if a mixture of the following are used: twenty conventional type feeder devices 81 and twenty multiple feeder devices or auto loading feeder devices 82 for which two tape reels TR per slot are required. Further, if two standalone type reel holding devices 7 are set up lined up independently in the X-axis direction, the overall quantity of carrier tapes CT that can be supplied increases from the original forty to eighty.

In the example in FIG. 4, auto loading feeder device 82 uses a first carrier tape CT supplied from a tape reel TR loaded in main-body-side reel holding section 35. Also, auto loading feeder device 82 holds the leading end of a second carrier tape CT supplied from a tape reel TR loaded in standalone type reel holding device 7, such that preparation of the next carrier tape to use is complete. In other words, the tape reel TR independently loaded in standalone type reel holding device 7 is used after the tape reel TR held by main-body-side reel holding section 35.

The first and second carrier tapes CT are fed upwards from the respective tape reels TR and inserted into a tape insertion opening at the front of auto loading feeder device 82. The first and second carrier tapes CT are separated by a large distance in the front-rear direction at a position close to tape reels TR, and gradually get closer together as they approach auto loading feeder device 82. Accordingly, the first and second carrier tapes CT do not get entangled along their respective feeding routes.

With auto loading feeder device 82, when the first carrier tape CT runs out, the second carrier tape CT is pulled from the tape reel TR loaded on standalone type reel holding device 7. At a convenient time, an operator removes the empty tape reel TR that held first carrier tape CT for which supply is complete from main-body-side reel holding section 35. This frees up a reel holding position on main-body-side reel holding section 35.

Next, the operator moves the tape reel from which the second carrier tape CT is being pulled from standalone type reel holding device 7 to the free reel holding position on main-body-side reel holding section 35. Further, the operator sets a tape reel TR on which is wound a third carrier tape CT holding the same type of component to the empty reel holding section of standalone type reel holding device 7. Then, the operator pulls the leading end of the third carrier tape CT and inserts it into auto loading feeder device 82. The above tape reel TR exchange work can be performed while component mounter 1 is operating. Thus, with auto loading feeder device 82, component supply is uninterrupted even without performing splicing.

Also, a multiple feeder device loaded on feeder attachment section 32 can be used at the same time as a tape reel TR loaded on main-body-side reel holding section 35 and an additional tape reel TR loaded on standalone type reel holding device 7. In this case too, splicing work can be performed at main-body-side reel holding section 35 and standalone type reel holding device 7 while component mounter 1 is operating. Thus, a multiple feeder device can alternately supply two types of components by feeding and rewinding two carrier tapes CT supplied from two tape reels TR. Also, with a multiple feeder device too, similar to the case of auto loading feeder device 82, the supply routes of the first and second carrier tapes do not get entangled.

Figure 5:
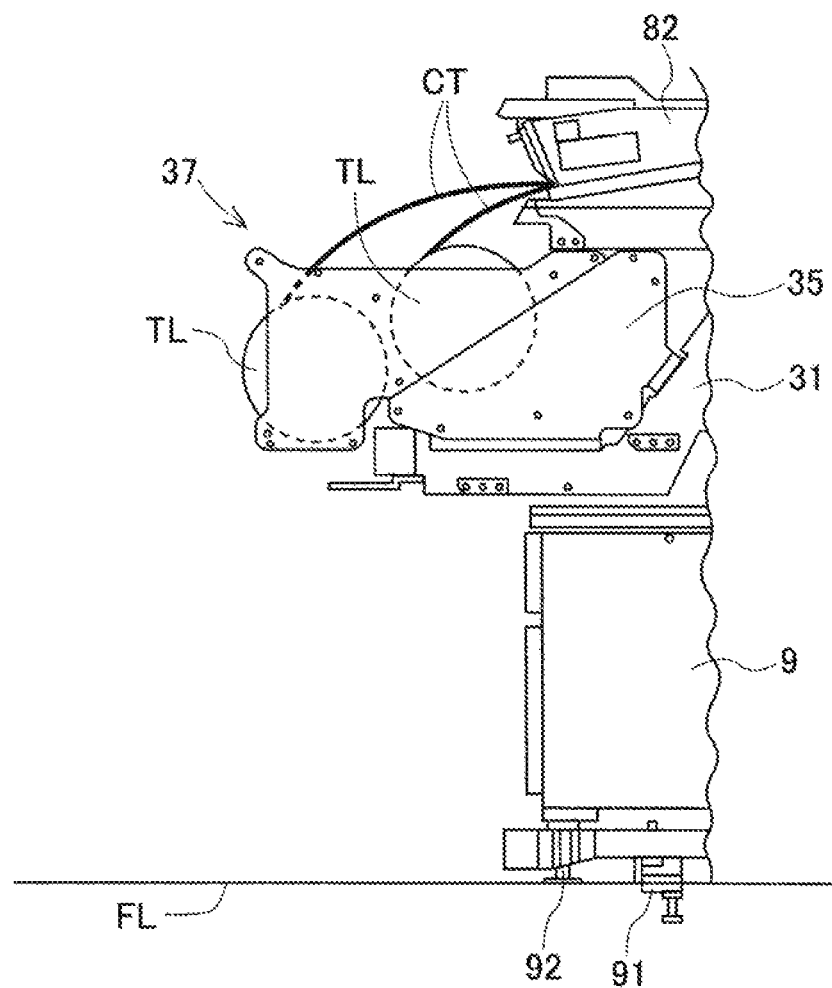
FIG. 5 is a side view showing the configuration of not the standalone type reel holding device, but a dedicated dual type reel holding section used to handle both conventional feeder devices and auto loading feeder devices.

Note that, there is a different method when conventional type feeder device 81, auto loading feeder device 82, and a multiple feeder device are used together. FIG. 5 is a side view showing the configuration of not standalone type reel holding device 7, but dedicated dual type reel holding section 37 used to handle both conventional type feeder devices 81 and auto loading feeder devices 82. Dual type reel holding section 37 holds two tape reels TR lined in a front-rear direction, such that carrier tape CT is supplied from each tape reel TR. Dual type reel holding section 37 is provided as an addition to main-body-side reel holding section 35, that is, is exchangeable with main-body-side reel holding section 35.

With the above different method, it is necessary to newly manufacture the same quantity of dual type reel holding sections 37 as there are auto loading feeder devices 82 and multiple feeder devices. Also, it is necessary to position each dual type reel holding section 37 directly in front of each auto loading feeder device 82 and multiple feeder device, meaning that component supply device 3 requires large scale modifications. Thus, compared to a case in which dual type reel holding section 37 is used, standalone type reel holding device 7 is compact, easy to use, and curtails cost increases.

4. Forms and Effects of Standalone Type Reel Holding Device 7

Standalone type reel holding device 7 of an embodiment above is configured to be set separately to component mounter 1 provided with component supply device 3, component supply device 3 including multiple feeder devices 81 and 82 configured to sequentially supply multiple components by feeding carrier tape CT in which multiple components are held and main-body-side reel holding section 35 configured to hold multiple tape reels TR around which are wound the carrier tapes CT in a rotatable and exchangeable manner, main-body-side reel holding section 35 being provided separately to the feeder devices, wherein standalone type reel holding device 7 holds separately-located tape reels TR different to the tape reels TR held by main-body-side reel holding section 35 in a rotatable and exchangeable manner, and supplies the carrier tapes CT wound on the separately-located tape reels TR to feeder devices 82.

Standalone type reel holding device 7 of an embodiment above, in a case in which a quantity of carrier tapes CT supplied from main-body-side reel holding section 35 provided on component supply device 3 is insufficient, is located separately to component mounter 1, holds a separately-located tape reel TR, and supplies carrier tape CT from the separately-located tape reel TR to feeder device 82. Thus, it is possible to increase the overall quantity of carrier tapes CT supplied to feeder devices 81 and 82 from main-body-side reel holding section 35 and standalone type reel holding device 7.

Further, modifications to component mounter 1 are not required, and the current main-body-side reel holding section 35 can be used. Thus, compared to conventional technology of manufacturing an entirely new reel holding section to exchange with the current one, standalone type reel holding device 7 is compact, has good usability, and curtails increases in costs.

Further, standalone type reel holding device 7 can be used regardless of the type or construction of feeder devices 81 and 82, therefore exhibits excellent compatibility and versatility.

Also, standalone type reel holding device 7 of an embodiment above is provided with casters for moving across floor FL on which component mounter 1 is set up, and stopper 77 for restricting movement across floor FL. Thus, standalone type reel holding device 7 can be freely arranged and is easy to use.

Also, standalone type reel holding device 7 of an embodiment above is provided separately to and below main-body-side reel holding section 35. Accordingly, there is no problem even if carrier tape CT is supplied in a slightly diagonal direction from standalone type reel holding device 7. Also, the two carrier tapes CT supplied from main-body-side reel holding section 35 and standalone type reel holding device 7 do not get entangled along their respective supply routes. Thus, operational reliability of component supply device 3 is good.

Also, when using a multiple feeder device, a separate tape reel TR can be used at the same time as a tape reel TR loaded on main-body-side reel holding section 35. And, when using auto loading feeder device 82, the separate tape reel TR is used after the tape reel loaded on main-body-side reel holding section 35, and when the tape reel loaded on main-body-side reel holding section 35 is removed to create a free reel holding position, the separate tape reel TR is moved to the free reel holding position.

Accordingly, standalone type reel holding device 7 has excellent usability, with exchange work of tape reels TR and splicing work of carrier tapes CT being allowed while component mounter 1 is operating.

5. Applications and Alternative Embodiments

Note that, the quantity of separate tape reels TR loaded on standalone type reel holding device 7 is not limited to twenty, and may be selected from the range of one to forty to match the quantity of slots 322. Also, a tape guide that acts as a guide for the supply route may be added as appropriate to enable smooth supply of carrier tape CT from standalone type reel holding device 7. Various other applications and modifications are possible for the present disclosure.

REFERENCE SIGNS LIST

1: component mounter; 3: component supply device; 31: feeder pallet; 32: feeder attachment section; 35: main-body-side reel holding section; 7: standalone type reel holding device; 71: bottom plate; 72: side plate; 73: dividing plate; 75: support shaft; 76: caster; 77: stopper; 81: feeder device; 82: auto loading feeder device; TR: tape reel; CT: carrier tape

The invention claimed is:

1. A standalone type reel holding device configured to be set separately to a component mounter provided with a component supply device, the component supply device including multiple feeder devices configured to sequentially supply multiple components by feeding carrier tape in which the multiple components are held and a main-body-side reel holding section configured to hold multiple tape reels around which are wound the carrier tapes in a rotatable and exchangeable manner, the main-body-side reel holding section being provided separately to or integrated with the feeder device, the standalone type reel holding device comprising:
   a bottom plate;
   separately-located tape reels, different to the tape reels held by the main-body-side reel holding section, supported on the bottom plate in a rotatable and exchangeable manner, carrier tapes wound on the separately-located tape reels configured to be supplied to the feeder devices; and
   casters on a bottom surface of the bottom plate configured to move the standalone type reel holding device on a floor relative to the component mounter.

2. The standalone type reel holding device according to claim 1, further comprising:
   a stopper configured to restrict movement with respect to the floor.

3. The standalone type reel holding device according to claim 1, wherein
   the standalone type reel holding device is located separately under the main-body-side reel holding section.

4. The standalone type reel holding device according to claim 1, wherein
   the separately-located tape reel is used at the same time as the tape reel held by the main-body-side reel holding section.

5. The standalone type reel holding device according to claim 1, wherein
   the separately-located tape reel is used after the tape reel held by the main-body-side reel holding section, and, in a case in which the tape reel held by the main-body-side reel holding section is removed thereby creating a free reel holding position, the separately-located tape reel is moved to the free reel holding position.

6. The standalone type reel holding device according to claim 1, further comprising:
a pair of side plates extending from a top surface of the bottom plate, the separately-located tape reels mounted between the pair of side plates.

7. The standalone type reel holding device according to claim 6, further comprising:
contact plates respectively extending rearward from the pair of the side plates, the contact plates configured to contact the component mounter.

* * * * *